(12) United States Patent
Miao et al.

(10) Patent No.: US 9,148,129 B2
(45) Date of Patent: Sep. 29, 2015

(54) DRIVER CIRCUIT WITH ASYMMETRIC BOOST

(71) Applicant: Finisar Corporation, Sunnyvale, CA (US)

(72) Inventors: Jason Miao, Sunnyvale, CA (US); Arik Zafrany, Santa Clara, CA (US); Georgios Kalogerakis, Mountain View, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 41 days.

(21) Appl. No.: 13/912,945

(22) Filed: Jun. 7, 2013

(65) Prior Publication Data

US 2014/0361813 A1 Dec. 11, 2014

(51) Int. Cl.
   H03B 1/00 (2006.01)
   H03K 3/00 (2006.01)
   H03K 3/01 (2006.01)
   H03K 5/12 (2006.01)
   H03K 5/156 (2006.01)
   H03K 19/003 (2006.01)

(52) U.S. Cl.
   CPC .. *H03K 3/01* (2013.01); *H03K 5/12* (2013.01); *H03K 5/1565* (2013.01); *H03K 19/00323* (2013.01)

(58) Field of Classification Search
   CPC .................................. H03B 1/00; H03K 3/00
   USPC .................................................. 327/108, 112
   See application file for complete search history.

(56) References Cited

U.S. PATENT DOCUMENTS

| 6,838,906 B2* | 1/2005 | Yen .................................. 326/81 |
| 8,373,451 B1* | 2/2013 | Ferguson ...................... 327/108 |
| 8,700,886 B2* | 4/2014 | Avss et al. ..................... 712/208 |
| 2005/0285648 A1 | 12/2005 | Wilson et al. |
| 2011/0156764 A1 | 6/2011 | Juang et al. |

FOREIGN PATENT DOCUMENTS

WO     2008/039781 A2     4/2008

OTHER PUBLICATIONS

Invitation to pay additional fees and, where applicable, protest fee as mailed Oct. 24, 2014 in related PCT Application No. PCT/US2014/041408.

International Search Report and Written Opinion of the International Searching Authority dated Jan. 13, 2015 as received in Application No. PCT/US2014/041408 (12 pages).

* cited by examiner

*Primary Examiner* — Hai L Nguyen
(74) *Attorney, Agent, or Firm* — Maschoff Brennan

(57) ABSTRACT

A circuit may include an input node configured to receive a signal and an output node configured to be coupled to a load. The circuit may also include a first circuit coupled between the input node and the output node, the first circuit being configured to receive the signal and drive the signal on the output node at a first voltage. The circuit may also include a signal adjust circuit configured to adjust a current of the signal driven by the first circuit. The signal adjust circuit may be configured to apply a first current adjustment to adjust the current of the signal at one but not both of a falling edge of the signal or a rising edge of the signal.

20 Claims, 6 Drawing Sheets

DRIVER CIRCUIT WITH ASYMMETRIC BOOST

FIELD

The embodiments discussed herein are related to a driver circuit with asymmetric boost.

BACKGROUND

Driver circuits may be implemented to drive electrical signals generated by one circuit to another circuit over a printed circuit board (PCB) trace, through an electrical connector, or over a transmission line of some other sort. For example, a driver circuit may drive electrical signals generated by a clock and data recovery circuit to a clocked data processing device.

In some circumstances, a driver circuit may be configured with pre-drivers that amplify an electrical signal before the electrical signal is driven by the driver circuit. Additionally, in some circumstances, a driver circuit may include additional circuitry at the output nodes for sending pre and/or post tap electrical signals on the output nodes along with a driven electrical signal. The pre and/or post tap electrical signals may compensate for signal loss of a driven electrical signal as the driven electrical signal is driven to another circuit.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

Some example embodiments generally relate to a driver circuit with asymmetric boost.

In an example embodiment, a circuit may include an input node configured to receive a signal and an output node configured to be coupled to a load. The circuit may also include a first circuit coupled between the input node and the output node. The first circuit may be configured to receive the signal and drive the signal on the output node at a first voltage. The circuit may also include a signal adjust circuit configured to adjust a current of the signal driven by the first circuit. The signal adjust circuit may be configured to apply a first current adjustment to adjust the current of the signal at one but not both of a falling edge of the signal or a rising edge of the signal.

In another example embodiment, a circuit may include an input node configured to receive a signal and an output node configured to be coupled to a load. The circuit may also include a first circuit coupled between the input node and the output node. The first circuit may be configured to receive the signal and to drive the signal on the output node at a first voltage. The circuit may also include a signal adjust circuit configured to provide additive boosting of the signal at the output node at one but not both of a rising edge of the signal or a falling edge of the signal. The signal adjust circuit may also be configured to provide subtractive boosting of the signal at the output node at one but not both of the rising edge of the signal or the falling edge of the signal.

In yet another example embodiment, a method of boosting a signal may include receiving a signal at an input node of a driver. The method may also include driving the signal on an output node of the driver at a first voltage. The output node may be configured to be coupled to a load. The method may also include providing additive boosting of the signal at the output node at one but not both of a rising edge of the signal or a falling edge of the signal. The method may also include providing subtractive boosting of the signal at the output node at one but not both of the rising edge of the signal or the falling edge of the signal.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description that follows or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

A more particular description of the invention will be rendered by reference to embodiments thereof, which are illustrated in the appended drawings. It is appreciated that these drawings depict only some embodiments of the invention and are therefore not to be considered limiting of its scope. The invention will be described and explained with additional specificity and detail through the use of the accompanying drawings in which.

DETAILED DESCRIPTION

Some embodiments described herein may include a driver circuit. The driver circuit may include an input node configured to receive a signal and an output node configured to be coupled to a load. For example, the input node of the driver circuit may be coupled to a transimpedance amplifier within an optical transceiver or other optoelectronic module. The driver circuit may drive signals from the transimpedance amplifier to a host device coupled to the optical transceiver. The load may be a load at the host device, such as current mode logic at the host side for receiving signals from the optical transceiver. As another example, the driver circuit may drive signals from the host device to a laser of the optoelectronic module where the laser is the load.

The driver circuit may include a first circuit coupled between the input node and the output node that may be configured to drive a signal on the output node at a first voltage. The driver circuit may also include a signal adjust circuit configured to provide additive boosting of the signal at the output node at one but not both of a rising edge of the signal or a falling edge of the signal. The signal adjust circuit may also provide subtractive boosting of the signal at the output node at one but not both of the rising edge of the signal or the falling edge of the signal. As a result, the driver circuit is able to select the rising edge of the signal or the falling edge of the signal for applying an additive or a subtractive boost.

By additive or subtractive boosting only at the rising or falling edge of the signal, or additive boosting at the rising edge and subtractive boosting at the falling edge or vice versa, the driver circuit is able to better adjust the signal to meet demands of the load than if the signal is only additive or subtractive boosted at both the rising and falling edge of the signal. For example, the signal may be generated within an optical transceiver and may be based on the response of a laser. By adjusting the signal, the driver circuit may be better able to compensate for the response of the laser to provide an eye opening of the signal at the load that is better than the eye opening of the signal without being adjusted.

Figure 1:
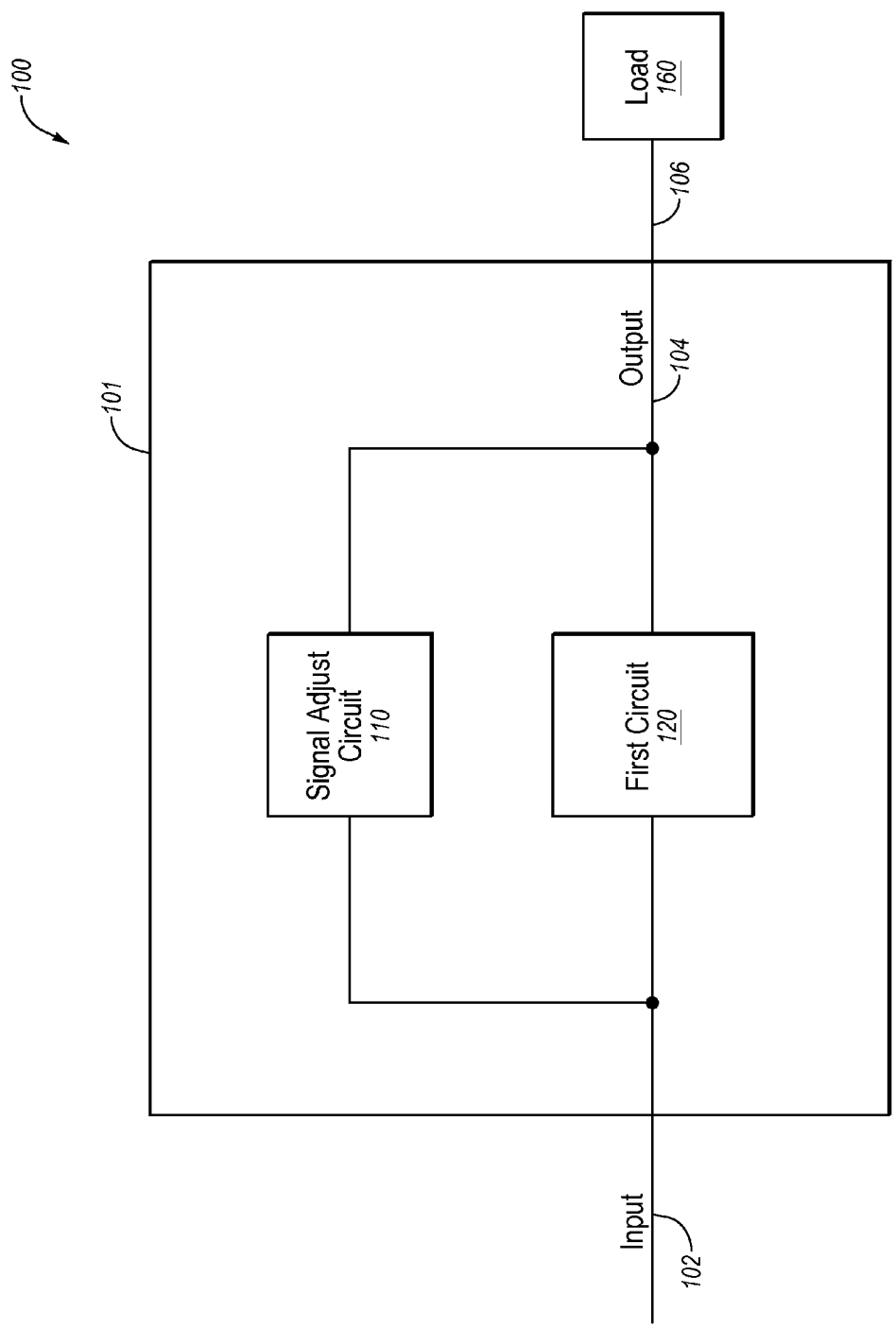
FIG. 1 illustrates an example circuit that includes a driver circuit.

FIG. 1 illustrates an example circuit 100 that includes a driver circuit 101, arranged in accordance with at least some embodiments described herein. The driver circuit 101 may include, but is not limited to, a signal adjust circuit 110, a first circuit 120, an input node 102, and an output node 104. As illustrated in FIG. 1, the output node 104 may be configured to be coupled to a load 160 by an electrical lead 106. The lead 106 may be a PCB trace or some other type of electrical lead and/or electrical connector and/or some combination thereof for connecting the output node 104 and the load 160. Alternately or additionally, the lead 106 may be a transmission line that couples the output node 104 to the load 160.

The input node 102 may be coupled to the signal adjust circuit 110 and to the first circuit 120. The signal adjust circuit 110 and the first circuit 120 may both be coupled to the output node 104. The input node 102 of the driver circuit 101 may be configured to receive a signal. The signal may be a high-speed or low-speed signal. For example, in some embodiments, the signal may be a 200 megabits/second signal, a 500 megabits/second signal, a 1 gigabit/second signal (Gb/s), a 10 Gb/s signal, a 20 Gb/s signal, or a 40 Gb/s signal, among others. In some embodiments, the input node 102 may be configured to receive a differential signal pair.

The output node 104 may be configured to receive a signal from the first circuit 120 and to transmit the signal to the load 160. The load 160 may be any type of load and may have any impedance. For example, in some embodiments, the load 160 may be a current mode logic termination that is implemented with a 50-ohm resistor.

The first circuit 120 may receive a signal from the input node 102 and may be configured to drive the signal to the load 160 by way of the output node 104. The first circuit 120 may also boost the current and/or voltage of the signal as the first circuit 120 drives the signal on the output node 104. The first circuit 120 may be configured to drive the signal at a predetermined voltage and/or with a predetermined current. For example, the first circuit 120 may be configured to drive the signal at 1 volt with a current of 20 milliamps.

In some embodiments, the first circuit 120 may drive the signal at a predetermined voltage and/or at a predetermined current based on the load 160. For example, the load 160 may require a signal to have a minimum voltage level to allow for reception of the signal without errors. In these and other embodiments, the first circuit 120 may drive the signal at or higher than the minimum voltage level.

The signal adjust circuit 110 may be configured to receive the signal from the input node 102 and to adjust a current of the signal driven by the first circuit 120. The signal adjust circuit 110 may adjust the current of the signal by applying a current adjustment at the output node 104. In some embodiments, the current adjustment may include the signal adjust circuit 110 sourcing current to the output node 104 to increase the current of the signal. In some embodiments, the current adjustment may include the signal adjust circuit 110 sinking current from the output node 104 to decrease the current of the signal.

The current adjustment, e.g., sinking or sourcing current may occur when the signal is transitioning from a high to a low state, referred to as a falling edge of the signal, or when the signal is transitioning from a low to high state, referred to as a rising edge of the signal. When the current adjustment results in the signal being driven more quickly from one state to another state, the current adjustment may be referred to herein as additive boosting. To perform an additive boost when the signal is transitioning from a high to a low state, current may be sunk by the signal adjust circuit 110. To perform an additive boost when the signal is transitioning from a low to a high state, current may be sourced by the signal adjust circuit 110. For example, using additive boosting the signal may be driven more quickly to the low state from the high state or to the high state from the low state. By driving the signal faster to another state, the rise or fall time of the signal may be reduced. By reducing the rise or fall time of the signal, an eye opening of the signal may be increased.

In some embodiments, the current adjustment may result in the signal being driven more slowly from one state to another state. In these and other embodiments, the current adjustment may be referred to herein as subtractive boosting. To perform a subtractive boost when the signal is transitioning from a high to a low state, current may be sourced by the signal adjust circuit 110. To perform a subtractive boost when the signal is transitioning from a low to a high state, current may be sunk by the signal adjust circuit 110. For example, the signal may be driven more slowly to the high state from the low state or to the low state from the high state. Driving the signal more slowly to another state may reduce ringing of the signal. Reducing ringing of the signal may increase an eye opening of the signal.

The signal adjust circuit 110 may be configured to apply a current adjustment on a rising edge of the signal, the falling edge of the signal, or on both of the rising edge and the falling edge of the signal. The current adjustment applied at the rising and falling edges of the signal may be the same or different. For example, in some embodiments, the signal adjust circuit 110 may apply a current adjustment that results in additive or subtractive boosting of the signal at the output node 104 at the rising edge of the signal and no current adjustment at the falling edge of the signal. Alternately or additionally, the signal adjust circuit 110 may apply a current adjustment that results in additive or subtractive boosting of the signal at the output node 104 at the falling edge of the signal and no current adjustment at the rising edge of the signal.

As other examples, the signal adjust circuit 110 may be configured to apply a first current adjustment that results in additive boosting of the signal at the output node 104 at the rising edge of the signal and to apply a second current adjustment that results in subtractive boosting of the signal at the output node 104 at the falling edge of the signal. Alternately or additionally, the signal adjust circuit 110 may be configured to apply a first current adjustment that results in subtractive boosting of the signal at the output node 104 at the rising edge of the signal and to apply a second current adjustment that results in additive boosting of the signal at the output node 104 at the falling edge of the signal.

Alternately or additionally, the signal adjust circuit 110 may apply a first current adjustment that results in additive boosting of the signal at the output node 104 at the rising edge of the signal and a second current adjustment that results in additive boosting of the signal at the output node 104 at the falling edge of the signal. Alternately or additionally, the signal adjust circuit 110 may apply a first current adjustment that results in subtractive boosting of the signal at the output node 104 at the rising edge of the signal and a second current adjustment that results in subtractive boosting of the signal at the output node 104 at the falling edge of the signal.

In some embodiments, the first and second current adjustments applied by the signal adjust circuit 110 may be the same magnitude or they may be of different magnitudes. Alternately or additionally, the signal adjust circuit 110 may be configured to apply the first and/or second current adjustment for a particular period of time after the rising and/or falling edge of the signal. In some embodiments, the particular period of time may be one symbol period of the signal. A symbol period of the signal may be a time during which one symbol (e.g., a bit where the symbol rate is equal to the data rate) is transmitted by the signal.

Modifications, additions, or omissions may be made to the circuit 100 without departing from the scope of the present disclosure. For example, the first circuit 120 and the signal adjust circuit 110 may include various circuit elements. For example, the first circuit 120 may include one or more transistors, of any of various types, to drive a signal on the output node 104. Alternately or additionally, the signal adjust circuit 110 may include one or more transistors, of any of various types, to apply a current adjustment to the signal. In some embodiments, the driver circuit 101 may be configured to drive a differential signal pair. In these and other embodiments, the signal discussed above may be one or both of the signals of the differential signal pair. In these and other embodiments, the first circuit 120 may include an $F_T$ doubler circuit. Alternately or additionally, additional circuits configured to adjust a signal received at the input node 102 may be coupled to the driver circuit 101.

Figure 2:
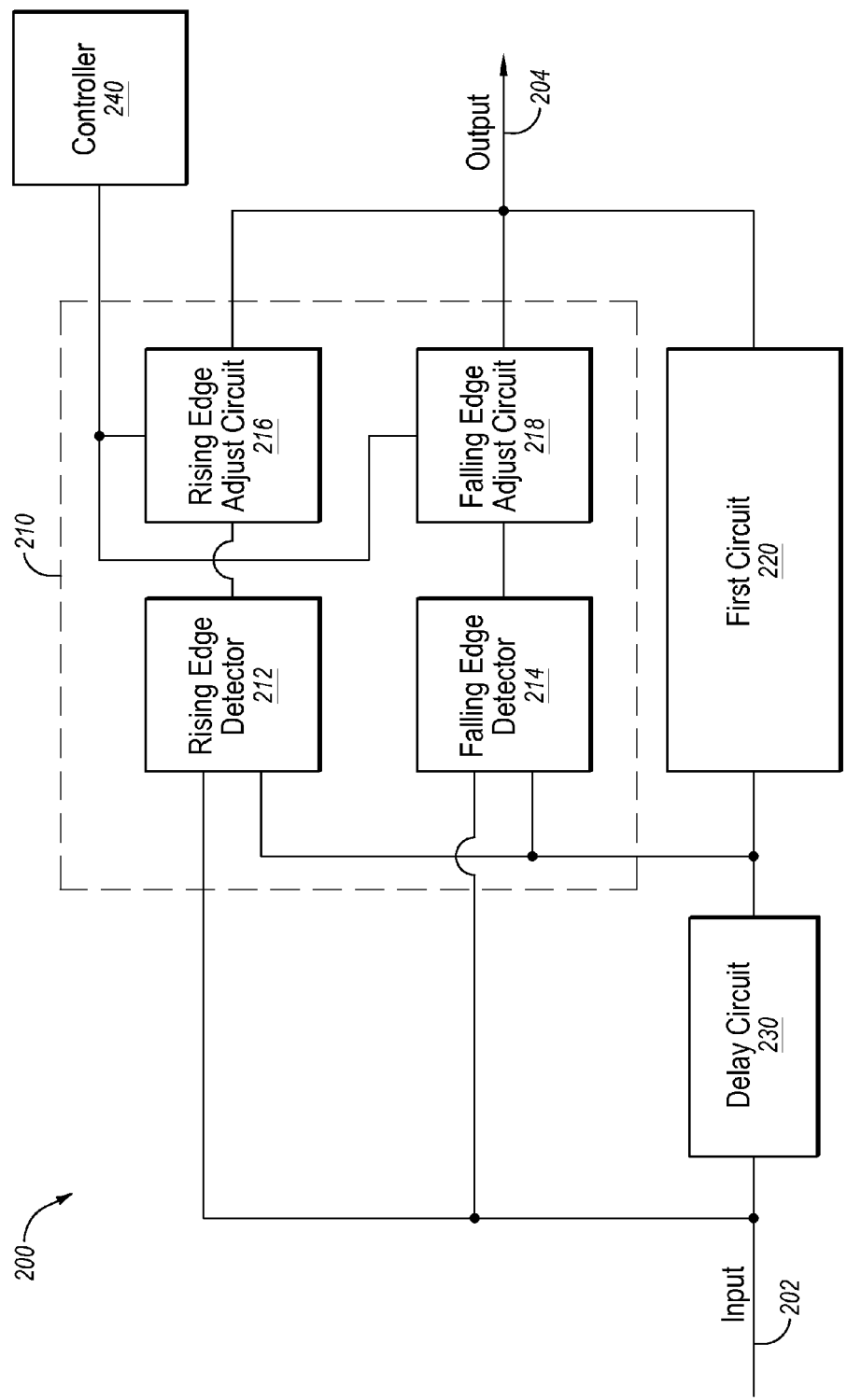
FIG. 2 illustrates an example driver circuit.

FIG. 2 illustrates an example driver circuit 200, arranged in accordance with at least some embodiments described herein. The driver circuit 200 is an example embodiment of the driver circuit 101 of FIG. 1. The driver circuit 200 may include, but is not limited to, a signal adjust circuit 210, a first circuit 220, a delay circuit 230, and a controller 240. The signal adjust circuit 210 may include a rising edge detector 212, a falling edge detector 214, a rising edge adjust circuit 216, a falling edge adjust circuit 218, an input node 202, and an output node 204. With reference to FIG. 2, the input node 202, the output node 204, and the first circuit 220 may be analogous to and/or correspond to the input node 102, the output node 104, and the first circuit 120, respectively, of FIG. 1. As such, no further description is provided of the input node 202, the output node 204, and the first circuit 220.

The input node 202 may be coupled to the signal adjust circuit 210 and the delay circuit 230. The delay circuit 230 may be configured to receive the signal from the input node 202 and to delay the signal. The delay circuit 230 may provide the signal after being delayed to the first circuit 220 and to the signal adjust circuit 210. The first circuit 220 and the signal adjust circuit 210 may be coupled to the output node 204. The first circuit 220 may be configured to drive the signal, after being delayed, on the output node 204.

The signal adjust circuit 210 may be configured to receive the signal from the input node 202 and to adjust a current of the signal driven by the first circuit 220. In particular, the signal adjust circuit 210 may be configured to apply a current adjustment on a rising edge of the signal, the falling edge of the signal, or on both of the rising edge and the falling edge of the signal.

The rising edge detector 212 within the signal adjust circuit 210 may be configured to detect rising edges of the signal. The rising edge detector 212 may be configured to receive the signal from the input node 202 and the signal after delay from the delay circuit 230. Based on the comparison of the signal and the signal after delay, the rising edge detector 212 may detect rising edges of the signal. In particular, the rising edge detector 212 may detect a rising edge of the signal before the first circuit 220 begins driving the rising edge of the signal because the first circuit 220 drives the signal after delay. As a result, the signal received by the rising edge detector 212 directly from the input node 202 is a signal that the first circuit 220 may drive in the future.

The rising edge detector 212 may detect rising edges based on the state of the signal and the state of the signal after delay. When the signal after delay is a low state and the signal is a high state, indicating the signal has a transition from a low state to a high state, the rising edge detector 212 may detect a rising edge of the signal. The rising edge detector 212 may indicate to the rising edge adjust circuit 216 that a rising edge has been detected.

The rising edge adjust circuit 216 may be configured to receive an indication of a rising edge of the signal from the rising edge detector 212 and to adjust the current of the signal being driven by the first circuit 220 during the rising edge of the signal. The rising edge adjust circuit 216 may adjust the current by additive boosting or subtractive boosting. When the rising edge adjust circuit 216 receives the indication of a rising edge of the signal, the first circuit 220 may not yet be driving the rising edge of the signal. The rising edge adjust circuit 216 may be configured to wait until the first circuit 220 begins driving the rising edge of the signal. As the first circuit 220 begins driving the rising edge of the signal at the output node 204, the rising edge adjust circuit 216 may be configured to apply a current adjustment to the rising edge of the signal when the rising edge of the signal is being driven by the first circuit 220 at the output node 204. The current adjustment may include additive boosting of the rising edge of the signal or subtractive boosting of the rising edge of the signal. In some embodiments, the current adjustment may be applied for one symbol period of the signal.

In some embodiments, the rising edge adjust circuit 216 may be configured to apply a current adjustment at every rising edge of the signal detected by the rising edge detector 212. Alternately or additionally, the rising edge adjust circuit 216 may be configured to apply a current adjustment at select rising edges of the signal. In these and other embodiments, the rising edge adjust circuit 216 may determine which rising edges of the signal to apply a current adjustment based on a signal provided by the controller 240. In some embodiments, the rising edge adjust circuit 216 may also adjust an amount of the current adjustment based on another signal provided by the controller 240. For example, in some embodiments, the rising edge adjust circuit 216 may apply additive boosting that supplies 5, 10, 15, 20, 25, or 30 or some other percent more current to the rising edge of signal being driven by the first circuit 220.

The falling edge detector 214 within the signal adjust circuit 210 may be configured to detect falling edges of the signal. The falling edge detector 214 may be configured to receive the signal from the input node 202 and the signal after delay from the delay circuit 230. Based on the comparison of the signal and the signal after delay, the falling edge detector 214 may detect falling edges of the signal. In particular, the falling edge detector 214 may detect a falling edge of the signal before the first circuit 220 begins driving the falling edge of the signal.

The falling edge detector 214 may detect falling edges based on the state of the signal and the state of the signal after delay. When the signal after delay is a high state and the signal is a low state, indicating the signal includes a transition from a high state to a low state, the falling edge detector 214 may detect a falling edge of the signal. The falling edge detector 214 may indicate to the falling edge adjust circuit 218 that a falling edge has been detected.

The falling edge adjust circuit 218 may be configured to receive an indication of a falling edge of the signal from the falling edge detector 214 and to adjust the current of the signal being driven by the first circuit 220 during the falling edge of the signal. The falling edge adjust circuit 218 may adjust the current by additive boosting or subtractive boosting.

When the falling edge adjust circuit 218 receives the indication of a falling edge of the signal, the first circuit 220 may not yet be driving the falling edge of the signal. The falling edge adjust circuit 218 may be configured to wait until the first circuit 220 begins driving the falling edge of the signal. As the first circuit 220 begins driving the falling edge of the signal at the output node 204, the falling edge adjust circuit 218 may be configured to apply a current adjustment to the falling edge of the signal when the falling edge of the signal is being driven by the first circuit 220 at the output node 204. The current adjustment may include additive boosting of the falling edge of the signal or subtractive boosting of the falling edge of the signal. In some embodiments, the current adjustment may be applied for one symbol period of the signal or any other suitable length of time.

In some embodiments, the falling edge adjust circuit 218 may be configured to apply a current adjustment at every falling edge of the signal detected by the falling edge detector 214. Alternately or additionally, the falling edge adjust circuit 218 may be configured to apply a current adjustment at select falling edges of the signal. In these and other embodiments, the falling edge adjust circuit 218 may determine at which falling edges of the signal to apply a current adjustment based on a signal provided by the controller 240. In some embodiments, the falling edge adjust circuit 218 may also adjust an amount of the current adjustment based on another signal provided by the controller 240. For example, in some embodiments, the falling edge adjust circuit 218 may apply subtractive boosting that increases the current by 5, 10, 15, 20, 25, or 30 or some other percent of the falling edge of signal being driven by the first circuit 220.

The controller 240 may be configured to provide signals to the falling edge adjust circuit 218 and the rising edge adjust circuit 216 to control the behavior of the falling edge adjust circuit 218 and the rising edge adjust circuit 216. In particular, the controller 240 may be configured to provide a current adjustment amount signal to the falling edge adjust circuit 218 and the rising edge adjust circuit 216 to control the amount of current adjustment (e.g., how much current is sourced or sunk) by the falling edge adjust circuit 218 and the rising edge adjust circuit 216.

Alternately or additionally, the controller 240 may be configured to provide an adjust enable signal to the falling edge adjust circuit 218 and the rising edge adjust circuit 216 to enable the falling edge adjust circuit 218 and the rising edge adjust circuit 216. Using the adjust enable signal, the controller 240 may control the falling edges to which the falling edge adjust circuit 218 applies a current adjustment and the rising edges to which the rising edge adjust circuit 216 applies a current adjustment. Alternately or additionally, the controller 240 may be configured to provide an adjust select signal to the falling edge adjust circuit 218 and the rising edge adjust circuit 216 to control whether the falling edge adjust circuit 218 and the rising edge adjust circuit 216 provide additive or subtractive boosting.

Modifications, additions, or omissions may be made to the driver circuit 200 without departing from the scope of the present disclosure. For example, the first circuit 220 and the signal adjust circuit 210 may include various circuit elements. For example, the first circuit 220 may include one or more transistors, of any of various types, to drive a signal on the output node 204. Alternately or additionally, the signal adjust circuit 210 may include one or more transistors, of any of various types, to apply a current adjustment to the signal. In some embodiments, the driver circuit 200 may be configured to drive a differential signal pair. In these and other embodiments, the signal discussed above may be one or both of the signals of the differential signal pair. Alternately or additionally, additional circuits configured to adjust a signal received at the input node 202 may be coupled to the driver circuit 200.

Figure 3:
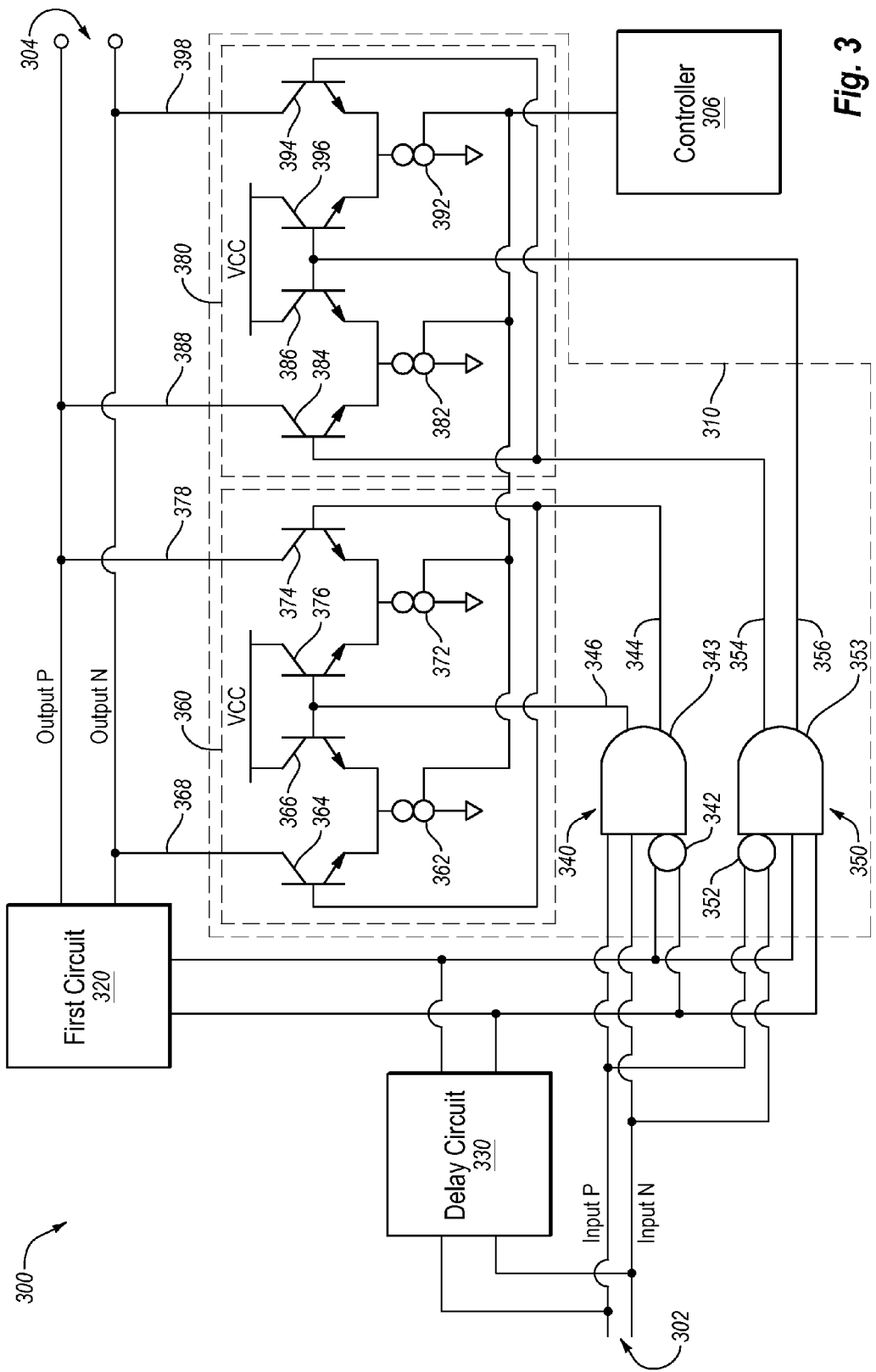
FIG. 3 illustrates another example driver circuit.

FIG. 3 illustrates another example driver circuit 300, arranged in accordance with at least some embodiments, described herein. The driver circuit 300 is another example embodiment of the driver circuit 101 of FIG. 1. The driver circuit 300 may include, but is not limited to, a signal adjust circuit 310, a first circuit 320, a delay circuit 330, an input node 302, an output node 304, and a controller 306. The signal adjust circuit 310 may include a rising edge detector 340, a falling edge detector 350, a rising edge adjust circuit 360, and a falling edge adjust circuit 380.

The driver circuit 300 may be similar to the driver circuit 200, but may be configured to drive a differential signal pair. In more detail, the input node 302 may include an input node P and an input node N. The output node 304 may include an output node P and an output node N. The driver circuit 300 may be configured to receive a first signal of a differential signal pair on the input node P and to drive the first signal onto the output node P. In some embodiments, the first signal of the differential signal pair may be a positive signal of the differential signal pair. The driver circuit 300 may also be configured to receive a second signal of the differential signal pair on the input node N and to drive the second signal onto the output node N. In some embodiments, the second signal of the differential signal pair may be a negative signal of the differential signal pair.

The input node 302, the output node 304, the controller 306, the signal adjust circuit 310, the rising edge detector 340, the falling edge detector 350, the rising edge adjust circuit 360, the falling edge adjust circuit 380, the first circuit 320, and the delay circuit 330 maybe be analogous to and/or correspond to the input node 202, the output node 204, the controller 240, the signal adjust circuit 210, the rising edge detector 212, the falling edge detector 214, the rising edge adjust circuit 216, the falling edge adjust circuit 218, the first circuit 220, and the delay circuit 230, respectively, of FIG. 2.

The rising edge detector 340 may include an inverter 342 and an AND gate 343. The inverter 342 may be configured to receive the input P and input N after being delayed by the delay circuit 330, invert the input P and input N after being delayed, and send the inverted and delayed input P and input N to the AND gate 343. The AND gate 343 may receive the inverted and delayed input P and input N from the inverter 342 and the input P and input N. The AND gate 343 may output a differential signal onto first and second rising edge control lines 344 and 346 based on the inverted and delayed input P and input N from the inverter 342 and the input P and input N. The output of the AND gate 343 may be such that the first rising edge control line 344 is held in a low state and the second rising edge control line 346 is held at a high state at non-rising edges of the signal. At rising edges of the signal, the first rising edge control line 344 is held at a high state and the second rising edge control line 346 is held at a low state.

The first and second rising edge control lines 344 and 346 may be provided to the rising edge adjust circuit 360.

The rising edge adjust circuit 360 may include an additive current source 362 and first and second additive transistors 364 and 366. The rising edge adjust circuit 360 may also include a subtractive current sink 372 and first and second subtractive transistors 374 and 376.

The bases of the first additive transistor 364 and the first subtractive transistor 374 may be coupled to the first rising edge control line 344. The bases of the second additive transistor 366 and the second subtractive transistor 376 may be coupled to the second rising edge control line 346. The emitters of the first additive transistor 364 and second additive transistor 366 may be coupled to the additive current source 362. The collector of the first additive transistor 364 may be coupled to the output N by the wire 368. The collector of the second additive transistor 366 may be coupled to VCC.

The emitters of the first subtractive transistor 374 and the second subtractive transistor 376 may be coupled to the subtractive current sink 372. The collector of the first subtractive transistor 374 may be coupled to the output P by the wire 378. The collector of the second subtractive transistor 376 may be coupled to VCC.

The additive current source 362 and the subtractive current sink 372 may be controlled by the controller 306. The controller 306 may enable and disable the additive current source 362 and the subtractive current sink 372. In some embodiments, the controller 306 enables either the additive current source 362 or the subtractive current sink 372 but not both at the same time. The controller 306 may also control the amount of current sourced by the additive current source 362 and the amount of current sunk by the subtractive current sink 372.

When the controller 306 enables the additive current source 362, the additive current source 362 sources current. At a non-rising edge of the signal, the second rising edge control line 346 may be high and the first rising edge control line 344 may be low. As a result, the first additive transistor 364 is not conducting and the second additive transistor 366 is conducting. The additive current source 362 thus sources current to VCC. At a rising edge of the signal, the second rising edge control line 346 may be low and the first rising edge control line 344 may be high. As a result, the first additive transistor 364 is conducting and the second additive transistor 366 is not conducting. The additive current source 362 thus sources current to the output N along wire 368 to adjust the current of the signal at the output node 304 during the rising edge of the signal. In particular, the additive current source 362 sources current to the output N along wire 368 to provide additive boosting of the signal at the output node 304 during the rising edge of the signal.

When the controller 306 enables the subtractive current sink 372, the subtractive current sink 372 sinks current. At a non-rising edge of the signal, the second rising edge control line 346 may be high and the first rising edge control line 344 may be low. As a result, the first subtractive transistor 374 is not conducting and the second subtractive transistor 376 is conducting. The subtractive current sink 372 thus sinks current from VCC. At a rising edge of the signal, the second rising edge control line 346 may be low and the first rising edge control line 344 may be high. As a result, the first subtractive transistor 374 is conducting and the second subtractive transistor 376 is not conducting. The subtractive current sink 372 thus sinks current from the output P along wire 378 to adjust the current of the signal at the output node 304 during the rising edge of the signal. In particular, the subtractive current sink 372 sinks current from the output P along wire 378 to provide subtractive boosting of the signal at the output node 304 during the rising edge of the signal.

The falling edge detector 350 may include an inverter 352 and an AND gate 353. The inverter 352 may be configured to receive the input P and input N, invert the input P and input N, and send the inverted input P and input N to the AND gate 353. The AND gate 353 may receive the inverted input P and input N from the inverter 352 and the input P and input N after being delayed by the delay circuit 330. The AND gate 353 may output a differential signal onto first and second falling edge control lines 354 and 356 based on the inverted input P and input N from the inverter 352 and the input P and input N after being delayed. The output of the AND gate 353 may be such that the first falling edge control line 354 is held in a low state and the second falling edge control line 356 is held at a high state at non-falling edges of the signal. At falling edges of the signal, the first falling edge control line 354 is held at a high state and the second falling edge control line 356 is held at a low state. The first and second falling edge control lines 354 and 356 may be provided to the falling edge adjust circuit 380.

The falling edge adjust circuit 380 may include an additive current source 382 and first and second additive transistors 384 and 386. The falling edge adjust circuit 380 may also include a subtractive current sink 392 and first and second subtractive transistors 394 and 396.

The bases of the first additive transistor 384 and the first subtractive transistor 394 may be coupled to the first falling edge control line 354. The bases of the second additive transistor 386 and the second subtractive transistor 396 may be coupled to the second falling edge control line 356. The emitters of the first additive transistor 384 and second additive transistor 386 may be coupled to the additive current source 382. The collector of the first additive transistor 384 may be coupled to the output P by the wire 388. The collector of the second additive transistor 386 may be coupled to VCC.

The emitters of the first subtractive transistor 394 and the second subtractive transistor 396 may be coupled to the subtractive current sink 392. The collector of the first subtractive transistor 394 may be coupled to the output N by the wire 398. The collector of the second subtractive transistor 396 may be coupled to VCC.

The additive current source 382 and the subtractive current sink 392 may be controlled by the controller 306. The controller 306 may enable and disable the additive current source 382 and the subtractive current sink 392. In some embodiments, the controller 306 enables either the additive current source 382 or the subtractive current sink 392 but not both at the same time. The controller 306 may also control the amount of current sourced by the additive current source 382 and the amount of current sunk by the subtractive current sink 392.

When the controller 306 enables the additive current source 382, the additive current source 382 sources current. At a non-falling edge of the signal, the second falling edge control line 356 may be high and the first falling edge control line 354 may be low. As a result, the first additive transistor 384 is not conducting and the second additive transistor 386 is conducting. The additive current source 382 thus sources current to VCC. At a falling edge of the signal, the second falling edge control line 356 may be low and the first falling edge control line 354 may be high. As a result, the first additive transistor 384 is conducting and the second additive transistor 386 is not conducting. The additive current source 382 thus sources current to the output P along wire 388 to adjust the current of the signal at the output node 304 during the falling edge of the signal. In particular, the additive current source 382 sources current to the output P along wire 388 to provide subtractive boosting of the signal at the output node 304 during the falling edge of the signal.

When the controller 306 enables the subtractive current sink 392, the subtractive current sink 392 sinks current. At a non-falling edge of the signal, the second falling edge control line 356 may be high and the first falling edge control line 354 may be low. As a result, the first subtractive transistor 394 is not conducting and the second subtractive transistor 396 is conducting. The subtractive current sink 392 thus sinks current from VCC. At a falling edge of the signal, the second falling edge control line 356 may be low and the first falling edge control line 354 may be high. As a result, the first subtractive transistor 394 is conducting and the second subtractive transistor 396 is not conducting. The subtractive current sink 392 thus sinks current from the output N along wire 398 to adjust the current of the signal at the output node 304 during the falling edge of the signal. In particular, the subtractive current sink 392 sinks current from the output N along wire 398 to provide additive boosting of the signal at the output node 304 during the falling edge of the signal.

The signal adjust circuit 310 may thus adjust a current of the signal driven by the first circuit 320. In particular, the signal adjust circuit 310 may be configured to apply a current adjustment, such as an additive or subtractive boost, on a rising edge of the signal, the falling edge of the signal, or on both of the rising edge and the falling edge of the signal.

In FIG. 3, the subtractive and additive transistors 364, 366, 374, 376, 384, 386, 394, and 396 are illustrated as n channel bipolar junction transistors (BJTs). The above description uses the nomenclature base, collector, and emitter generically to represent different terminals of the BJTs in FIG. 3. The use of the names base, collector, and emitter may be used to describe generically the terminals of a BJT, or other types of transistors, such as a metal-oxide-semiconductor field-effect transistor (MOSFET), junction gate field-effect transistors (JFET), and insulated gate bipolar transistors.

In some embodiments, the subtractive and additive transistors 364, 366, 374, 376, 384, 386, 394, and 396 may be MOSFETs, JFETs, insulated gate bipolar transistors, or some combination of JFETs, insulated gate bipolar transistors, MOSFETs, and BJTs. Additionally, FIG. 3 depicts the subtractive and additive transistors 364, 366, 374, 376, 384, 386, 394, and 396 as being n-channel transistors. P-channel transistors or some combination of n-channel and p-channel transistors may also be used. Additional modifications, additions, or omissions may be made to the driver circuit 300 without departing from the scope of the present disclosure. For example, in some embodiments, additional active and/or passive circuit elements may be included in the driver circuit 300. Furthermore, additional active or passive circuit elements may be included in the driver circuit 300 to align the timing of the signal adjust circuit 310 with the first circuit 320 so that the signal adjust circuit 310 adjusts the current of the signal, e.g., either the current of the output P or the output N, at approximately the same time as the first circuit 320 drives a rising or falling edge of the signal.

Figure 4:
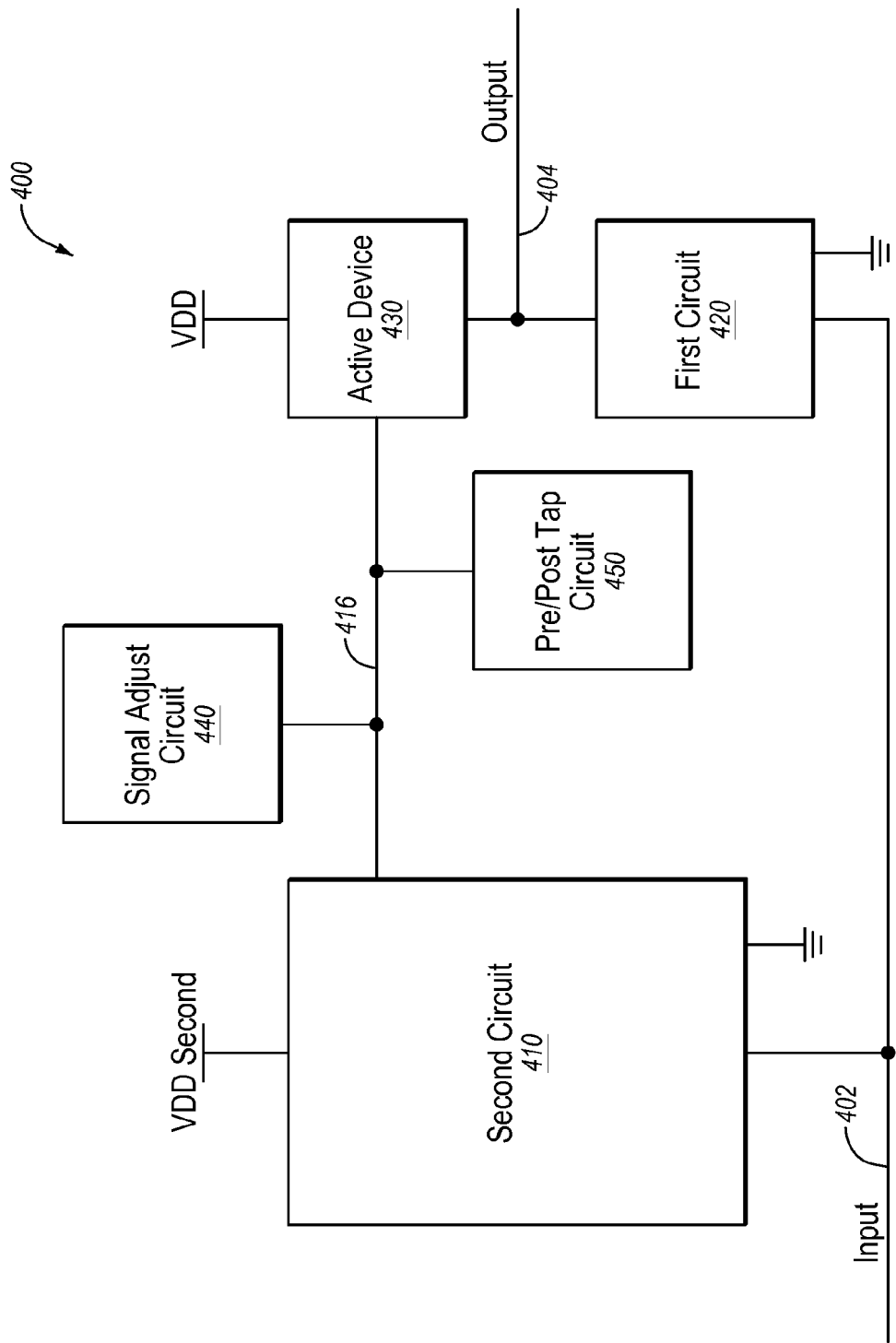
FIG. 4 illustrates another example driver circuit.

FIG. 4 illustrated another example driver circuit 400, arranged in accordance with at least some embodiments, described herein. The driver circuit 400 is yet another example embodiment of the driver circuit 101 of FIG. 1. The driver circuit 400 may include, but is not limited to, a first circuit 420, a second circuit 410, an active device 430, an input node 402, an output node 404, an intermediate node 416, a signal adjust circuit 440, and a pre/post tap circuit 450. The first circuit 420, the input node 402, the output node 404, and the signal adjust circuit 440 may be analogous to and/or correspond to the first circuit 120, the input node 102, the output node 104, and the signal adjust circuit 110, respectively, of FIG. 1, the first circuit 220, the input node 202, the output node 204, and the signal adjust circuit 210, respectively, of FIG. 2, and/or the first circuit 320, the input node 302, the output node 304, and the signal adjust circuit 310, respectively, of FIG. 3.

The input node 402 may be coupled to the second circuit 410 and to the first circuit 420. The first circuit 420 and the active device 430 may both be coupled to the output node 404. The second circuit 410 and the active device 430 may be coupled by the intermediate node 416. The active device 430 may be an active circuit element, such as a transistor or other circuit element. The signal adjust circuit 440 and the pre/post tap circuit 450 may also be coupled to the intermediate node 416.

The first circuit 420 may receive a signal from the input node 402 and may be configured to drive the signal on the output node 404. The second circuit 410 may be configured to receive the signal from the input node 402 and to drive the active device 430 at the intermediate node 416 with the signal at a voltage level that is approximately equal to the voltage level of the signal at the output node 404. By maintaining a voltage level at the intermediate node 416 that is approximately equal to the voltage level of the signal at the output node 404, a majority of or approximately all of the current provided by the first circuit 420 to the output node 404 may be driven to a load (not illustrated) coupled to the output node 404. The first circuit 420 may provide current to the output node 404 by either sourcing or sinking the current.

By providing the majority of or approximately all of the current provided by the first circuit 420 to a load, the power consumption of the driver circuit 400 may be reduced as compared to a driver circuit that splits the current provided by a corresponding first circuit between a corresponding load and other circuit elements within the driver circuit.

For example, known driver circuits do not include circuit elements corresponding to the second circuit 410 and the active device 430 of the driver circuit 400. These known driver circuits may instead include a resistor or other passive circuit element(s) coupled between a voltage supply (hereinafter VDD) and an output node and a driving circuit coupled to the output node, with the output node coupled to a load. The current provided by the driving circuit when driving a signal to the load may be divided between the resistor and/or other passive circuit elements and the load. As a result, the driving circuit may have to provide twice the current required by the load so that the load receives its required current. Providing twice the current increases the power consumption of these known driver circuits. In contrast, the driver circuit 400 is configured so that a majority of or approximately all of the current provided by the first circuit 420 may be provided to a load coupled to the output node 404, reducing the power consumption of the driver circuit 400 as compared to the known driver circuits discussed above. Further details concerning a driver circuit arranged as described in FIG. 4 that results in reduced power consumption is described in U.S. patent application Ser. No. 13/774,817, filed on Feb. 22, 2013, which is incorporated herein by reference in its entirety.

The pre/post tap circuit 450 may be configured to drive a pre cursor signal and/or a post cursor signal onto the intermediate node 416. The pre cursor signal and the post cursor signal may be modified versions of the signal being driven on the output node 404. In particular, a pre cursor signal may be a signal that corresponds to a signal that has yet to be driven by the second and first circuits 410 and 420. A post cursor signal may be a signal that corresponds to a signal that has been or is currently being driven by the second and first circuits 410 and 420. In some embodiments, the pre and/or post cursor signals may be time-shifted versions of a signal that is driven by the second and first circuits 410 and 420. In these and other embodiments, the pre and/or post cursor signal may be used as a wave-shaping signal that is a scaled version of a signal to shape the signal transmitted from the output node 404. The pre and post cursor signals may assist in compensating for signal loss as a signal is transmitted from the output node 404.

In some embodiments, including the pre/post tap circuit 450 and the signal adjust circuit 440 at the intermediate node 416 may result in reduced power consumption by the driver circuit 400. The reduced power consumption may be because of a signal from the pre/post tap circuit 450 and/or the current adjustment from the signal adjust circuit 440 being amplified by the second circuit 410 before reaching the output node 404. Because the signal from the first pre/post tap circuit 450 and/or the current adjustment from the signal adjust circuit 440 is amplified, the signal generated by the pre/post tap circuit 450 and/or the current adjustment from the signal adjust circuit 440 may be smaller than if the signal and/or current adjustment was output on the output node 404. Generating a smaller signal or current adjustment may consume less power and result in reduced power consumption of the driver circuit 400.

For example, when the signal adjust circuit 440 is analogous with the signal adjust circuit 310 of FIG. 3, the wires 368, 378, 388, and 398 may be coupled to the intermediate node 416 of FIG. 4. In this configuration, current sunk or sourced by the signal adjust circuit 440 may be reduced as compared to the current sunk or sourced by the signal adjust circuit 310 in FIG. 3, but may result in a similar current adjustment to the signal. Modifications, additions, or omissions may be made to the driver circuit 400 without departing from the scope of the present disclosure.

Figure 5:
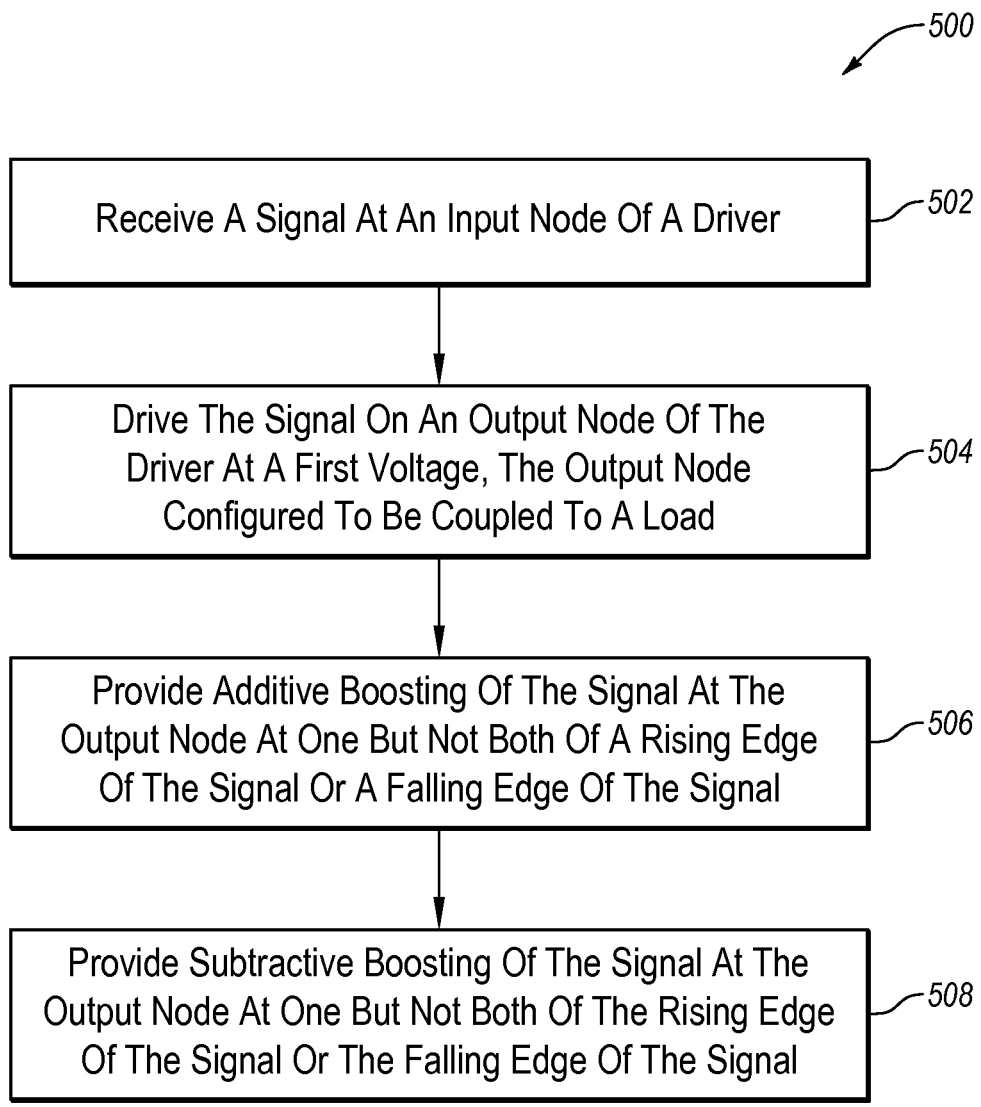
FIG. 5 is a flowchart of an example method of boosting a signal.

FIG. 5 is a flowchart of an example method 500 of boosting a signal, arranged in accordance with at least some embodiments described herein. The method 500 may be implemented, in some embodiments, by a driver circuit, such as the driver circuits 101, 200, 300, and/or 400 of FIG. 1, 2, 3, or 4, respectively. Although illustrated as discrete blocks, various blocks may be divided into additional blocks, combined into fewer blocks, or eliminated, depending on the desired implementation.

The method 500 may begin at block 502 where a signal at an input node of a driver may be received. In block 504, the signal on an output node of the driver may be driven at a first voltage. The output node may be configured to be coupled to a load.

In block 506, additive boosting of the signal at the output node may be provided at one but not both of a rising edge of the signal or a falling edge of the signal.

In block 508, subtractive boosting of the signal at the output node may be provided at one but not both of the rising edge of the signal or the falling edge of the signal. In some embodiments, the providing the additive boosting of the signal at the output node at one but not both of the rising edge of the signal or the falling edge of the signal may occur during a first period. Alternately or additionally, the providing the subtractive boosting of the signal at the output node at one but not both of the rising edge of the signal or the falling edge of the signal may occur during a second period. In some embodiments, the first and second periods may not overlap.

In some embodiments, the additive boosting of the signal may be provided at the rising edge of the signal and the subtractive boosting of the signal may be provided at the falling edge of the signal. Alternately or additionally, the additive boosting of the signal may be provided at the falling edge of the signal and the subtractive boosting of the signal may be provided at the rising edge of the signal.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments. For instance, the method 500 may further include varying an amount of the additive boosting or the subtractive boosting.

Figure 6:
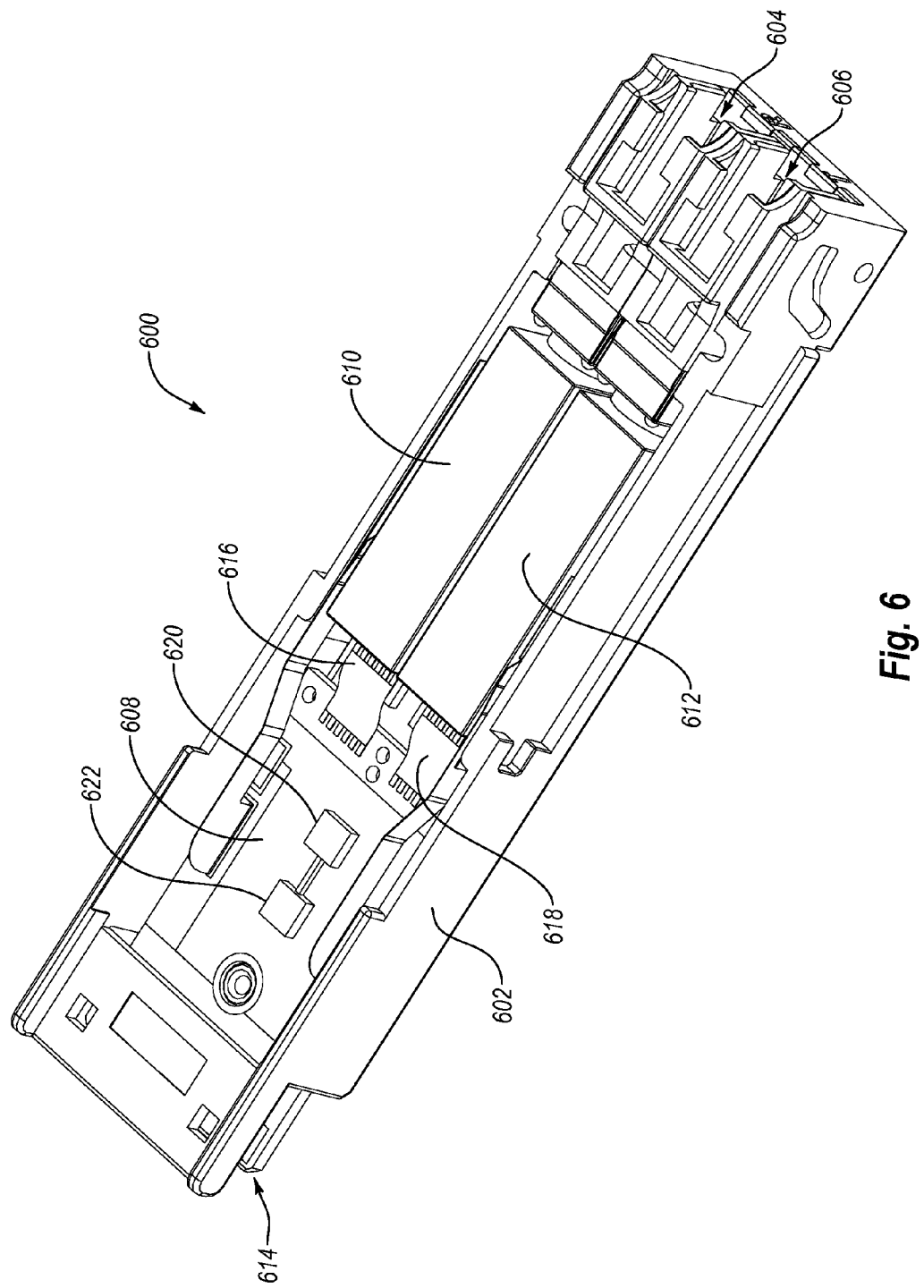
FIG. 6 is a perspective view of an example optoelectronic module that may include a driver circuit.

FIG. 6 is a perspective view of an example optoelectronic module 600 (hereinafter "module 600") that may include a driver circuit 622, arranged in accordance with at least some embodiments described herein. The module 600 may be configured for use in transmitting and receiving optical signals in connection with a host device (not shown).

As illustrated, the module 600 may include, but is not limited to, a bottom housing 602, a receive port 604, and a transmit port 606, both defined in the bottom housing 602; a PCB 608 positioned within the bottom housing 602, the PCB 608 having the driver circuit 622 and a first circuit 620 positioned thereon; and a receiver optical subassembly (ROSA) 610 and a transmitter optical subassembly (TOSA) 612 also positioned within the bottom housing 602. An edge connector 614 may be located on an end of the PCB 608 to enable the module 600 to electrically interface with the host device. As such, the PCB 608 facilitates electrical communication between the host device and the ROSA 610 and TOSA 612.

The module 600 may be configured for optical signal transmission and reception at a variety of data rates including, but not limited to, 1 Gb/s, 10 Gb/s, 20 Gb/s, 40 Gb/s, 100 Gb/s, or higher. Furthermore, the module 600 may be configured for optical signal transmission and reception at various distinct wavelengths using wavelength division multiplexing (WDM) using one of various WDM schemes, such as Coarse WDM, Dense WDM, or Light WDM.

Furthermore, the module 600 may be configured to support various communication protocols including, but not limited to, Fibre Channel and High Speed Ethernet. In addition, although illustrated in a particular form factor in FIG. 6, more generally, the module 600 may be configured in any of a variety of different form factors including, but not limited to, the Small Form-factor Pluggable (SFP), the enhanced Small Form-factor Pluggable (SFP+), the 10 Gigabit Small Form-factor Pluggable (XFP), the C Form-factor Pluggable (CFP), and the Quad Small Form-factor Pluggable (QSFP) multi-source agreements (MSAs).

The ROSA 610 may house one or more optical receivers, such as photodiodes, that are electrically coupled to an electrical interface 616. The one or more optical receivers may be configured to convert optical signals received through the receive port 604 into corresponding electrical signals that are relayed to the host device through the electrical interface 616 and the PCB 608. The TOSA 612 may house one or more optical transmitters, such as lasers, that are electrically coupled to another electrical interface 618. The one or more optical transmitters may be configured to convert electrical signals received from the host device by way of the PCB 608 and the electrical interface 618 into corresponding optical signals that are transmitted through the transmit port 606.

The driver circuit 622, which may be similar to and/or correspond to the driver circuits 101, 200, 300, and/or 400 of FIG. 1, 2, 3, or 4, respectively, and may be configured to drive electrical signals relayed to the PCB 608 through the electrical interface 616 to the host device. In some embodiments, the electrical signals may pass through the first circuit 620 before being driven by the driver circuit 622. In these and other embodiments, the first circuit 620 may be a clock and data recovery circuit. In some embodiments, the module 600 may omit the first circuit 620. In these and other embodiments, the first circuit 620 may drive the electrical signals from the PCB 608 to the TOSA 612. In some embodiments, a driver circuit, such as the driver circuits 101, 200, 300, and/or 400 of FIG. 1, 2, 3, or 4, respectively, may be incorporated into the ROSA 610 and may be used to drive electrical signals from the ROSA 610 through the electrical interface 616 to the PCB 608.

The module 600 illustrated with respect to FIG. 6 is one architecture in which embodiments of the present disclosure may be employed. It should be understood that this specific architecture is only one of countless architectures in which embodiments may be employed. The scope of the present disclosure is not intended to be limited to any particular architecture or environment.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A circuit comprising:
an input node configured to receive a signal;
an output node configured to be coupled to a load;
a first circuit coupled between the input node and the output node, the first circuit configured to receive the signal and drive the signal on the output node at a first voltage; and
a signal adjust circuit configured to adjust a current of the signal driven by the first circuit, the signal adjust circuit configured to apply a first current adjustment to adjust the current of the signal at one but not both of a falling edge of the signal or a rising edge of the signal.

2. The circuit of claim 1, wherein when the signal adjust circuit is configured to apply the first current adjustment at the falling edge of the signal, the signal adjust circuit is further configured to apply a second current adjustment at the rising edge of the signal.

3. The circuit of claim 1, wherein when the signal adjust circuit is configured to apply the first current adjustment to the signal at the rising edge of the signal, the signal adjust circuit is further configured to apply a second current adjustment to the signal at the falling edge of the signal.

4. The circuit of claim 1, wherein the first current adjustment results in adding current to or subtracting current from the current of the signal at the output node.

5. The circuit of claim 1, wherein the signal is differential and includes a positive signal and a negative signal, wherein the signal adjust circuit is further configured to apply the first current adjustment to the positive signal or to the negative signal.

6. The circuit of claim 1, wherein an amount of current applied by the first current adjustment to the signal may be adjusted.

7. The circuit of claim 1, wherein the signal adjust circuit is further configured to apply the first current adjustment to selected falling edges of the signal or selected rising edges of the signal.

8. The circuit of claim 1, further comprising:
an active device coupled to the output node; and
a second circuit coupled to the input node and to the active device at an intermediate node, the second circuit configured to receive the signal and to drive the signal to the active device at a second voltage, wherein the signal adjust circuit is configured to apply the first current adjustment at the intermediate node.

9. The circuit of claim 8, wherein the current in the signal adjust circuit is reduced compared to the adjustment to the current of the signal at the output node.

10. A circuit comprising:
an input node configured to receive a signal;
an output node configured to be coupled to a load;
a first circuit coupled between the input node and the output node, the first circuit configured to receive the signal and drive the signal on the output node at a first voltage; and
a signal adjust circuit configured to provide both additive boosting of the signal at the output node at one but not both of a rising edge of the signal or a falling edge of the signal and to provide subtractive boosting of the signal at the output node at one but not both of the rising edge of the signal or the falling edge of the signal.

11. The circuit of claim 10, wherein the signal adjust circuit is configured to provide the additive boosting of the signal at one but not both of the rising edge of the signal or the falling edge of the signal during a first period and to provide the subtractive boosting of the signal at one but not both of the rising edge of the signal or the falling edge of the signal during a second period, wherein the first and second periods do not overlap.

12. The circuit of claim 10, wherein the signal adjust circuit is further configured:
to provide the additive boosting of the signal at the rising edge of the signal and the subtractive boosting of the signal at the falling edge of the signal; or to provide the additive boosting of the signal at the falling edge of the signal and the subtractive boosting of the signal at the rising edge of the signal.

13. The circuit of claim 10, wherein the signal adjust circuit is further configured to vary an amount of the additive boosting and the subtractive boosting.

14. The circuit of claim 10, wherein the signal adjust circuit is further configured to apply additive or subtractive boosting to selected falling edges of the signal or to selected rising edges of the signal.

15. The circuit of claim 10, wherein the signal is differential and includes a positive signal and a negative signal, wherein the signal adjust circuit is further configured to provide the additive boosting or the subtractive boosting to the positive signal or the negative signal.

16. The circuit of claim 10, wherein the signal adjust circuit is further configured to provide the additive boosting of the signal at the output node at selected rising edges of the signal or at selected falling edges of the signal and to provide the subtractive boosting of the signal at the output node at the selected rising edge of the signal or at the selected falling edge of the signal.

17. A method of boosting a signal, the method comprising:
receiving a signal at an input node of a driver;
driving the signal on an output node of the driver at a first voltage, the output node configured to be coupled to a load;

providing additive boosting of the signal at the output node at one but not both of a rising edge of the signal or a falling edge of the signal; and providing subtractive boosting of the signal at the output node at one but not both of the rising edge of the signal or the falling edge of the signal.

18. The method of claim 17, wherein the providing the additive boosting of the signal at the output node at one but not both of the rising edge of the signal or the falling edge of the signal occurs during a first period and the providing the subtractive boosting of the signal at the output node at one but not both of the rising edge of the signal or the falling edge of the signal occurs during a second period, wherein the first and second periods do not overlap.

19. The method of claim 17, wherein the additive boosting of the signal is provided at the rising edge of the signal and the subtractive boosting of the signal is provided at the falling edge of the signal or the additive boosting of the signal is provided at the falling edge of the signal and the subtractive boosting of the signal is provided at the rising edge of the signal.

20. The method of claim 17, further comprising varying an amount of the additive boosting or the subtractive boosting.

* * * * *